(12) United States Patent
Zhou et al.

(10) Patent No.: US 8,932,927 B2
(45) Date of Patent: Jan. 13, 2015

(54) SEMICONDUCTOR STRUCTURE AND METHOD FOR MANUFACTURING THE SAME

(75) Inventors: Huajie Zhou, Beijing (CN); Qiuxia Xu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 115 days.

(21) Appl. No.: 13/816,065

(22) PCT Filed: Dec. 1, 2011

(86) PCT No.: PCT/CN2011/083326
§ 371 (c)(1),
(2), (4) Date: Feb. 8, 2013

(87) PCT Pub. No.: WO2013/013471
PCT Pub. Date: Jan. 31, 2013

(65) Prior Publication Data
US 2013/0134516 A1    May 30, 2013

(30) Foreign Application Priority Data
Jul. 27, 2011    (CN) .......................... 2011 1 0212808

(51) Int. Cl.
*H01L 21/00*    (2006.01)
*H01L 29/66*    (2006.01)
*H01L 29/78*    (2006.01)

(52) U.S. Cl.
CPC ........ *H01L 29/66477* (2013.01); *H01L 29/785* (2013.01); *H01L 29/66795* (2013.01)
USPC ............................. 438/268; 438/275; 438/151

(58) Field of Classification Search
USPC .......................................... 438/268, 275, 166
See application file for complete search history.

(56) References Cited

U.S. PATENT DOCUMENTS

| 6,413,802 B1 * | 7/2002 | Hu et al. ....................... 438/151 |
| 2009/0008705 A1 * | 1/2009 | Zhu et al. ...................... 257/327 |

FOREIGN PATENT DOCUMENTS

CN    101477986 A    7/2009

OTHER PUBLICATIONS

International Preliminary Examination Report issued Jan. 28, 2014 in connection with the corresponding PCT Application No. PCT/CN2011/083326.

* cited by examiner

*Primary Examiner* — Richard Booth
(74) *Attorney, Agent, or Firm* — Enshan Hong; VLP Law Group LLP

(57) ABSTRACT

The present application discloses a semiconductor device structure and a method for manufacturing the same, wherein the method comprises: forming a semiconductor substrate comprising a local SOI structure having a local buried isolation dielectric layer; forming a fin on the silicon substrate on top of the local buried isolation dielectric layer; forming a gate stack structure on the top and side faces of the fin; forming source/drain structures in the fin on both sides of the gate stack structure; and performing metallization. The present invention makes use of traditional quasi-planar based top-down processes, thus the manufacturing process thereof is simple to implement; the present invention exhibits good compatibility with CMOS planar process and can be easily integrated, therefore, short channel effects are suppressed desirably, and MOSFETs are boosted to develop towards a trend of downscaling size.

10 Claims, 4 Drawing Sheets

SEMICONDUCTOR STRUCTURE AND METHOD FOR MANUFACTURING THE SAME

CROSS REFERENCE TO RELATED APPLICATIONS

This is a U.S. national stage of international application No. PCT/CN2011/083326 filed on Dec. 1, 2011, which claims priority to Chinese Patent Application No. 201110212808.2, filed on Jul. 27, 2011, the content of which is incorporated herein by reference in its entirety.

FIELD OF THE INVENTION

The present invention relates to semiconductor manufacturing field, particularity, to a method for manufacturing bulk silicon Fin Field-Effect Transistors (FinFET).

BACKGROUND OF THE INVENTION

As the integrated circuit industry has been developed according to Moore's law, feature sizes of CMOS devices are continuously scaled down, planar bulk silicon CMOS device structures are now facing severe challenges. In order to overcome these problems, various new device structures have been invented; among these new device structures, Fin Field-Effect Transistor (FinFETs) has been regarded as one of the new structure devices that will most probably replace bulk silicon CMOS devices, and therefore is under hot research nowadays all over the world.

FinFET structure devices were manufactured on SOI substrates in early time, and the manufacturing process thereof is much simpler than processes dealing with bulk silicon substrates. However, SOI FinFETs still suffer from many shortcomings like high manufacturing cost, poor heat dissipation, floating body effects and poor compatibility with CMOS process. In order to overcome aforesaid problems in SOI FinFETs, researchers begin research of manufacturing FinFET devices on bulk silicon substrates, i.e. bulk silicon FinFET. Nonetheless, as compared to SOI FinFET devices, the ordinary bulk silicon FinFET structure devices still have following defects: short channel effects (SCE) have not been suppressed desirably; current leaking path would still form in fin at channel bottoms so as to cause obvious current leakage; and doping profile cannot be controlled easily.

In order to overcome abovementioned problems and to boost application of FinFET structure devices as soon as possible, further research in said area has to be done, because this is of great significance to both application of FinFET structure devices and development of semiconductor industry.

SUMMARY OF THE INVENTION

In one aspect, the present invention provides a semiconductor device structure, which comprises: a fin located on a local buried isolation dielectric layer, and the bottom of the fin is connected to a substrate through a body-contact; wherein the fin has a channel region located between a source and a drain; wherein the local buried isolation dielectric layer isolates other part of the fin than that connected with the substrate through a body-contact from the substrate; and the body-contact enables at least part of the channel region of the fin to form direct physical and electrical contact with the substrate; a gate electrode the direction of which is perpendicular to the direction of the fin, and a channel region is formed at a region where the fin and the gate electrode cross; gate dielectric existing between the gate electrode and the fin; source and drain regions, which are located on both sides of the channel region and the gate electrode.

In another aspect, the present invention provides a manufacturing method, which comprises: forming a semiconductor substrate comprising a local SOI structure having a local buried isolation dielectric layer; forming a fin on the silicon substrate on top of the local buried isolation dielectric layer; forming a gate stack structure on the top and side faces of the fin; forming source/drain structures in the fin on both sides of the gate stack structure; and performing metallization.

In order to fulfill aforesaid aims, main steps of the present invention comprise: forming a semiconductor substrate comprising a local SOI structure having a local buried isolation dielectric layer; forming a fin on the silicon substrate on top of the local buried isolation dielectric layer; forming a gate stack structure on the top and side faces of the fin; forming source/drain structures in the fin on both sides of the gate stack structure; and performing metallization.

Preferably, the step for forming the semiconductor substrate comprising the local SOI structure having a local buried isolation dielectric layer comprises: forming a dielectric layer on a semiconductor substrate; performing lithography and etching the dielectric layer to form a dielectric layer island and a body-contact hole; forming a layer of amorphous Si material on the semiconductor substrate; transforming the amorphous Si material into a monocrystalline material and implementing chemical mechanical polish (CMP) to the same to form a semiconductor substrate comprising the local SOI structure.

Preferably, the material for the dielectric layer includes $SiO_2$, TEOS, LTO or $Si_3N_4$, and the thickness thereof is 20-100 nm.

Preferably, at the step of forming a layer of amorphous material on the semiconductor substrate, the amorphous material may be formed by means of low-pressure chemical vapor deposition (LPCVD), ion beam sputtering or the like; and the thickness of the amorphous material is 200 nm-1000 nm.

Preferably, at the step of transforming the amorphous Si material into the monocrystalline material and implementing chemical mechanical polish (CMP) to the same to form the semiconductor substrate comprising the local SOI structure, the amorphous Si material may be transformed to the monocrystalline material by means of a lateral solid phase epitaxial (LSPE) technology, laser recrystallization, or recrystallization through a halogen lamp or a strip heater.

Preferably, the step for forming the fin on the Si substrate above the local buried isolation dielectric layer comprises: exposing positive photoresist through electron beam and etching the Si substrate above the local buried isolation dielectric layer till the buried isolation dielectric layer so as to form at least two recesses embedded into the semiconductor substrate, whereby a fin is formed therebetween.

Preferably, the thickness of the fin is 10-60 nm.

Preferably, the step for forming a gate stack structure on the top and side faces of the fin comprises: forming a gate dielectric layer and a gate electrode material on the top and side faces of the fin; performing lithography and etching to form a gate electrode stack structure.

Preferably, prior to the formation of the source/drain structures in the fin on both sides of the gate stack structure, the method further comprises: forming a first sidewall spacer on both sides of the fin; implementing angled ion implantation to form source/drain extension regions in the fin; or implementing angled ion implantation to form a halo implantation region in the fin.

Preferably, the step for forming the source/drain structures in the fin on both sides of the gate stack structure comprises: forming a second sidewall spacer on both sides of the fin; performing ion implantation to form source/drain doping; and forming source/drain silicide.

Preferably, the semiconductor substrate is a bulk silicon substrate.

As shown in foregoing technical solution, the present invention brings forth following favorable effects.

1. The semiconductor device structure and the manufacturing method provided by the present invention make it practical to manufacture FinFET devices on bulk silicon substrates, which overcomes self-heating effects and floating body effects existing in SOI FinFET devices, and reduces manufacturing cost as well.

2. The semiconductor device structure and the manufacturing method provided by the present invention make it easy to form local SOI structures on bulk silicon substrates and easy to manufacture fin structures isolated from substrates, so as to considerably alleviate difficulty for manufacturing bulk silicon FinFET devices.

3. According to the semiconductor device structure and the manufacturing method provided by the present invention, the manufacturing processes are simple to implement, integration is quite easy, and compatibility with planar CMOS process is very good.

BRIEF DESCRIPTION OF THE DRAWINGS

Aforesaid and other objectives, characteristics and advantages of the present invention are made more evident according to perusal of the following detailed description of exemplary embodiment(s) in conjunction with accompanying drawings, in which.

REFERENCE SIGNS

Figure 1:
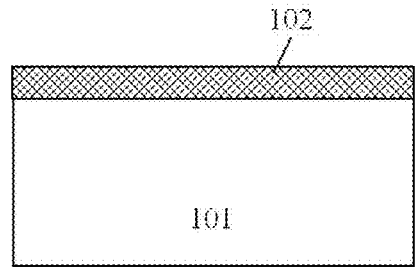
FIGS. 1~7 illustrate cross-sectional diagrams of structures at respective stages of a method for manufacturing a semiconductor device according to an embodiment of the present invention.

101, Si substrate; 102, dielectric layer; 103, body-contact hole; 104, amorphous Si layer; 105, STI isolation layer, 106, recess structure; 107, fin; 108 gate dielectric layer; 109, gate electrode.

It should be noted that component(s) illustrated in the drawings might not be drawn to scale but for illustrative only, thus they should not be interpreted as limitations to the present invention. Same or similar reference signs in accompanying drawings denote same or similar elements.

DETAILED DESCRIPTION OF THE INVENTION

Here below, the present invention is described in detail in view of embodiments illustrated in the accompanying drawings. However, it should be understood that the description is exemplary but not to limit the scope of the present invention. Besides, description of conventional components, processing technology and crafts are omitted in the following text in order not to unnecessarily obscure the present invention.

Diagrams of layer structures according to embodiments of the present invention are illustrated in accompanying drawings, whereas the diagrams are not drawn to scale, wherein some details are enlarged while certain details might be omitted for purpose of clarity. Various regions, shapes of layers, and relative sizes, positional relationship thereof shown in the drawings are illustrative only, slight difference might occur because of permitted manufacturing difference or technical limits in practice; besides, a person of ordinary skill in the art can otherwise design regions/layers in different shapes, sizes, relative positions according to needs in practice.

FIGS. 1~7 illustrate cross-sectional diagrams of structures at respective stages of a method for manufacturing a semiconductor device according to an embodiment of the present invention. Here below, the respective steps according to an embodiment of the present invention are described in detail in conjunction with the accompanying drawings.

First, with reference to FIG. 1, a dielectric layer 102 is formed on a semiconductor substrate 101. The material for the dielectric layer may be a material selected from a group consisting of $SiO_2$, TEOS, LTO, and $Si_3N_4$ or other dielectric materials, which is preferably $SiO_2$ in embodiments of the present invention and is formed by means of thermal growing method with a thickness of 20-100 nm. The semiconductor substrate 101 may be made of a substrate material conventionally used in semiconductor manufacturing field, which is preferably a bulk Si substrate in the embodiment of the present invention.

Figure 2A:
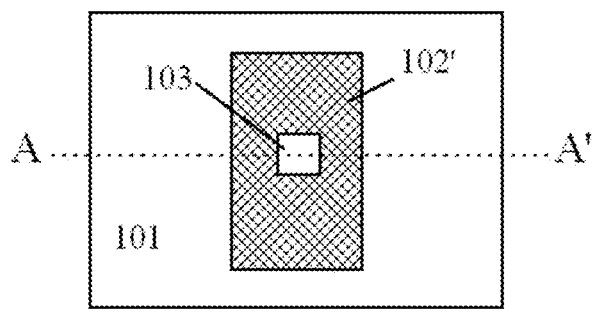
Figure 2B:
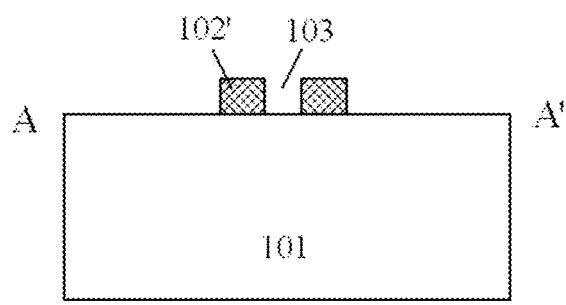

Next, as shown in FIG. 2A and FIG. 2B, a dielectric layer island 102' and a body-contact hole 103 are formed on the semiconductor substrate 101. FIG. 2A illustrates a top view of the semiconductor substrate 101; FIG. 2B illustrates a cross-sectional view along AA' direction. The method for forming the dielectric layer island 102' and the body-contact hole 103 may be: exposing photoresist through lithography or electron beam and etching the dielectric layer 102 by means of reactive ion etch to form the dielectric layer island 102' and the body-contact hole 103.

Figure 3:
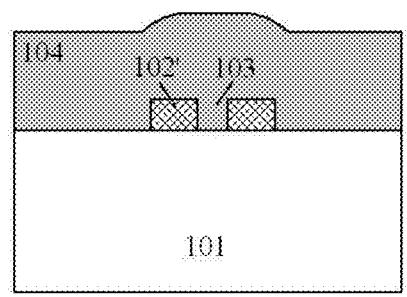

FIG. 3 shows a cross sectional diagram illustrating the formation of a layer of amorphous Si layer 104 on the semiconductor substrate. The method for forming the amorphous Si layer 104 may comprise low-pressure chemical vapor deposition (LPCVD), ion beam sputtering or the like; LPCVD is preferred in embodiments of the present invention. The thickness of the amorphous Si layer 104 may be about 200 nm-1000 nm.

Figure 4:
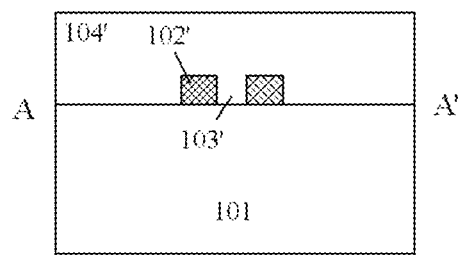

Next, as shown in FIG. 4, the amorphous Si layer 104 is transformed into a monocrystalline Si layer 104', to which chemical mechanical polish (CMP) is performed then to form a semiconductor substrate comprising a local SOI structure having a local buried isolation dielectric layer. The method for transforming the amorphous Si layer 104 into the monocrystalline Si layer 104' may comprise a lateral solid phase epitaxial (LSPE) technology, laser recrystallization, or recrystallization through a halogen lamp or a strip heater; wherein, the LSPE technology is preferred in embodiments of the present invention. A typical process of the lateral solid phase epitaxial (LSPE) technology may comprise: first, implementing vertical solid phase epitaxy to the amorphous Si layer 104 in direct contact with the semiconductor substrate 101, in the vertical direction, so as to transform the same into a monocrystalline Si layer 104'; then, implementing lateral solid phase epitaxy to the amorphous Si layer 104 laid over the dielectric layer island 102' so as to transform the same into the monocrystalline Si layer 104'; finally, transforming the complete amorphous Si layer 104 into the monocrystalline Si layer 104'.

Figure 5:
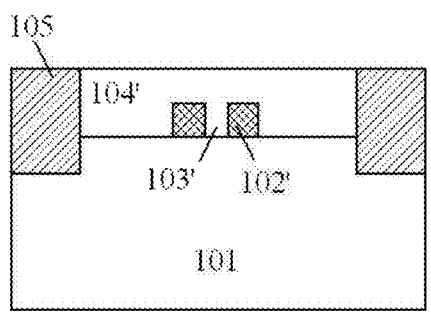

Next, an STI isolation structure 105 may be formed on the semiconductor substrate 101, as shown in FIG. 5.

Figure 6A:
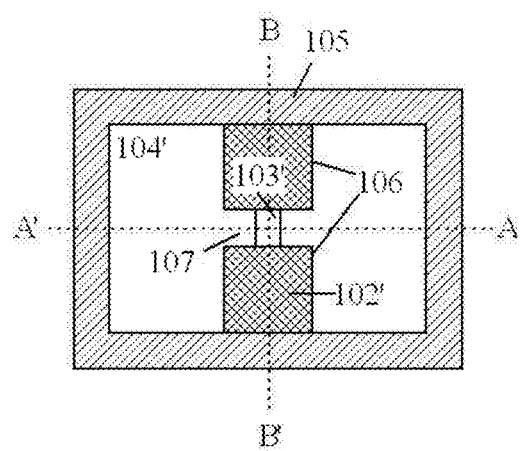
Figure 6B:
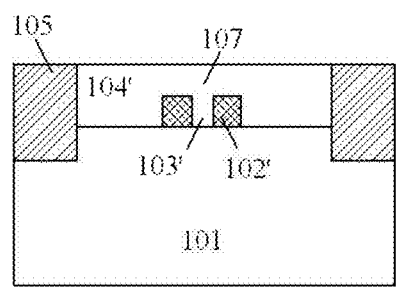
Figure 6C:
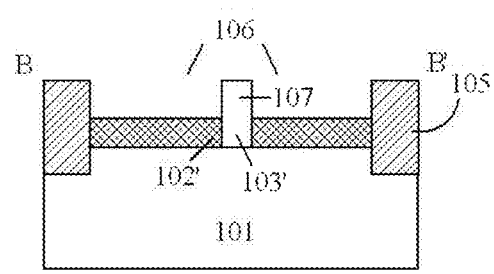

FIG. 6A illustrate the top view of the semiconductor substrate 101, while FIG. 6B and FIG. 6C illustrate cross-sectional views along AA' and BB' directions shown in FIG. 6A, respectively. As shown in FIG. 6B and FIG. 6C, the monocrystalline Si layer 104' is etched to form a pair of recess structures 106, meanwhile, a fin 107 is formed between the recesses. The bottom of the fin 107 is connected to the substrate through a body-contact 103'. The body-contact is favorable for suppressing floating body effects of devices; meanwhile, the body-contact 103' is further favorable for heat dissipation at channels of devices so as to enhance device performance. The method for etching to form the recess structures 106 may be, for example, exposing photoresist through electron beam and etching the same through reactive ion etch to form steep recess structures 106 with a thickness of about 200-400 nm. The shape of the recesses is exemplary and is not to limit the scope of the present invention. The thickness of the fin 107 is 10-60 nm.

Figure 7A:
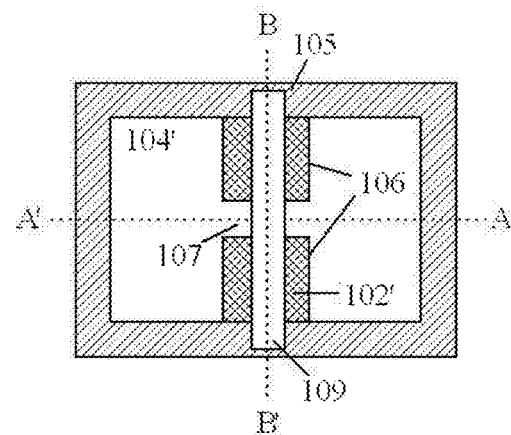
Figure 7B:
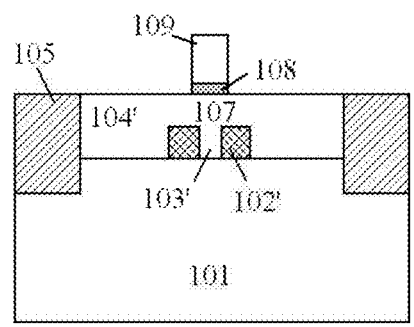
Figure 7C:
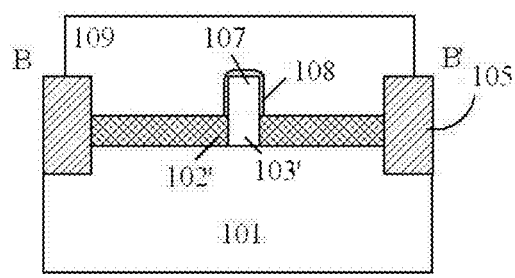

Next, with reference to FIG. 7A, FIG. 7B and FIG. 7C, a gate dielectric layer material 108 and a gate electrode material 109 are formed on the whole substrate, which then are etched to form a gate electrode stack structure. FIG. 7A illustrate a top view of the semiconductor substrate 101, while FIG. 7B and FIG. 7C illustrate cross-sectional views along AA' and BB' directions shown in FIG. 7A, respectively. The gate dielectric layer material 108 may be an ordinary gate dielectric material like $SiO_2$, or other high-k dielectric material, for example, SiON and HfAlON, HfTaON, HfSiON, $Al_2O_3$ or the like, which is preferably HfSiON in the embodiment of the present invention and may be formed by means of low-pressure chemical vapor deposition, metal organic chemical vapor deposition or atom layer deposition; the equivalent oxide thickness of the gate dielectric is 5 to 100 Å. The gate electrode material 109 may be a refractory metal like W, Ti, Ta, Mo and a metal nitride, for example, TiN, TaN, HfN, MoN or other material as appropriate; the gate electrode material may be formed by means of low-pressure chemical vapor deposition, metal organic chemical vapor deposition, atom layer deposition or other method as appropriate; and the thickness thereof may be selected from 2000-5000 Å.

Next, prior to formation of the source/drain structures in the fin on both sides of the gate stack structure, the method further comprises: forming a first sidewall spacer on both sides of the fin; performing angled ion implantation to form source/drain extension regions in the fin; alternatively, performing angled ion implantation to form halo implantation regions in the fin.

Next, a gate sidewall spacer may be formed on sidewall of the gate stack. The gate sidewall spacer may be formed through conventional technique, which thus is not described here in order not to obscure the present invention.

Then, ion implantation is performed in the semiconductor substrate on both sides of the gate stack to form source/drain regions and to form source and drain silicide.

Finally, metallization is performed to form a interconnect structure to lead out the electrode. The metallization may be performed according to conventional techniques, which thus is not described in detail here in order not to obscure.

Furthermore, the embodiments of the present invention are able to realize manufacturing of semiconductor devices on bulk silicon substrates. The method applies traditional quasi-planar based top-down processes, thus the manufacturing process thereof is simple for implementation, exhibits good compatibility with CMOS planar process and can be easily integrated.

As stated in foregoing description, some technical details like patterning and etching of respective layers have not been described specifically. However, those skilled in the art should understand that layers and regions in desired shape may be formed through various means in the prior art. Additionally, those skilled in the art also may design a method totally different from the method stated above, so as to form the same structure.

The present invention has been described in detail in conjunction with embodiments thereof, however, aforesaid embodiments are provided for explaining the prevent invention only and are not to limit the scope of the present invention. The scope of the present invention is defined by the appended claims and equivalence thereof. A person of ordinary skill in the art can make various alternations, substitutions and modifications to the embodiments without departing from the scope of the present invention and the scope as defined by the appended claims.

What is claimed is:

1. A manufacturing method, comprising:
   forming a dielectric layer on a semiconductor substrate;
   performing lithography and etching the dielectric layer to form a dielectric layer island and a body-contact hole;
   forming a layer of amorphous Si material on the semiconductor substrate;
   transforming the amorphous Si material into a monocrystalline material and implementing chemical mechanical polish (CMP) to the same so that the semiconductor substrate comprises a local SOI structure, which has a local buried isolation dielectric layer;
   forming a fin the local buried isolation dielectric layer;
   forming a gate stack structure on top and side faces of the fin;
   forming source/drain structures in the fin on both sides of the gate stack structure; and
   performing metallization.

2. The method of claim 1, wherein the material for the dielectric layer includes $SiO_2$, TEOS, LTO or $Si_3N_4$, and the thickness thereof is 20-100 nm.

3. The method of claim 1, wherein the step of forming a layer of amorphous Si material on a semiconductor substrate, the amorphous Si material is conducted by means of low-pressure chemical vapor deposition (LPCVD), or ion beam sputtering; and the thickness of the amorphous Si material is 200 nm-1000 nm.

4. The method of claim 1, wherein at the step for transforming the amorphous Si material into the monocrystalline material and implementing chemical mechanical polish (CMP) to the same, the amorphous Si material is transformed to the monocrystalline material by means of a lateral solid phase epitaxial technology, laser recrystallization, or recrystallization through a halogen lamp or a strip heater.

5. The method of claim 1, wherein the step for forming the fin on the local buried isolation dielectric layer comprises: exposing positive photoresist by electron beam and etching the same through reactive ion etch to form at least two recesses embedded into the semiconductor substrate.

6. The method of claim 5, wherein the thickness of the fin is 10-60 nm.

7. The method of claim 1, wherein the step for forming a gate stack structure on the top and side faces of the fin comprises:
   forming a gate dielectric layer and a gate electrode material on the top and side faces of the fin; and
   performing lithography and etching to form the gate electrode stack structure.

8. The method of claim 1, wherein, prior to the formation of the source/drain structures in the fin on both sides of the gate stack structure, the method further comprises:
   forming a first sidewall spacer on both sides of the fin;

implementing angled ion implantation to form source/drain extension regions in the fin; or implementing angled ion implantation to form a halo implantation region in the fin.

9. The method of claim 1, wherein, the step for forming the source/drain structures in the fin on both sides of the gate stack structure comprises:

forming a second sidewall spacer on both sides of the fin;

performing ion implantation to form source/drain doping; and forming source/drain silicide.

10. The method of claim 1, wherein, the semiconductor substrate is a bulk silicon substrate.

* * * * *